United States Patent
Cao et al.

(10) Patent No.: US 8,736,338 B2
(45) Date of Patent: May 27, 2014

(54) HIGH PRECISION SINGLE EDGE CAPTURE AND DELAY MEASUREMENT CIRCUIT

(75) Inventors: Lipeng Cao, Austin, TX (US); Carol G. Pyron, Austin, TX (US); Kenneth R. Burch, Austin, TX (US); Ramon V. Enriquez, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 93 days.

(21) Appl. No.: 13/444,195

(22) Filed: Apr. 11, 2012

(65) Prior Publication Data

US 2013/0271196 A1   Oct. 17, 2013

(51) Int. Cl.
*H03K 3/00*   (2006.01)
*G06F 1/04*   (2006.01)

(52) U.S. Cl.
USPC .............. 327/291; 327/261; 341/166; 331/57

(58) Field of Classification Search
USPC .............. 327/156, 291, 261; 341/166; 331/57
See application file for complete search history.

(56) References Cited

U.S. PATENT DOCUMENTS

| | | | | |
|---|---|---|---|---|
| 7,688,126 B2 * | 3/2010 | Henzler et al. | ................. | 327/261 |
| 7,688,242 B2 * | 3/2010 | Shimizu et al. | ............... | 341/155 |
| 7,715,493 B2 * | 5/2010 | Ravi et al. | ...................... | 375/296 |
| 7,791,525 B2 * | 9/2010 | Rivoir | ........................... | 341/166 |
| 7,884,751 B2 * | 2/2011 | Shimizu et al. | ............... | 341/166 |
| 7,928,888 B1 * | 4/2011 | Chiu et al. | ..................... | 341/161 |
| 8,138,843 B2 * | 3/2012 | Straayer et al. | ................. | 331/57 |
| 8,193,963 B2 * | 6/2012 | Wang et al. | .................... | 341/166 |
| 8,325,076 B2 * | 12/2012 | Yousif et al. | ................... | 341/166 |
| 8,390,349 B1 * | 3/2013 | Ravi et al. | ...................... | 327/156 |
| 8,471,736 B1 * | 6/2013 | Booth et al. | .................. | 341/115 |
| 8,487,708 B2 * | 7/2013 | Hayashi | .......................... | 331/57 |
| 2004/0150447 A1 * | 8/2004 | Chang | ........................... | 327/175 |
| 2005/0258868 A1 * | 11/2005 | Komatsu | .......................... | 326/83 |
| 2008/0069292 A1 * | 3/2008 | Straayer et al. | .................. | 377/46 |
| 2008/0129574 A1 * | 6/2008 | Choi et al. | ...................... | 341/166 |
| 2008/0238752 A1 * | 10/2008 | Shimizu et al. | ................ | 341/155 |
| 2008/0267280 A1 * | 10/2008 | Yousif et al. | ................... | 375/239 |
| 2009/0309622 A1 | 12/2009 | Joshi et al. | | |
| 2010/0283653 A1 * | 11/2010 | Dai et al. | ....................... | 341/166 |
| 2010/0315141 A1 | 12/2010 | Cao et al. | | |
| 2011/0084863 A1 * | 4/2011 | Chiu et al. | ..................... | 341/141 |
| 2012/0112841 A1 * | 5/2012 | Hayashi | ............................ | 331/2 |
| 2012/0230450 A1 * | 9/2012 | Sidiropoulos et al. | ........ | 375/316 |

OTHER PUBLICATIONS

S. Sunter et al., BIST of I/O Circuit Parameters via Standard Boundary Scan, IEEE International Test Conference, 2010.
M. Tripp et al., Elimination of Traditional Functional Testing of Interface Timings at Intel, IEEE ITC Test Conference, 2004.
B. Provost, AC IO Loopback Design for High Speed uProcessor IO Test, IEEE ITC Test Conference, 2004.

(Continued)

*Primary Examiner* — Ryan Jager
(74) *Attorney, Agent, or Firm* — Terrile, Cannatti, Chambers & Holland, LLP; Michael Rocco Cannatti

(57) ABSTRACT

A method and circuit for providing on-chip measurement of the delay between two signals includes first and second delay chains (241, 242) having different delay values connected to sampling latches (222-227) which each include a data input coupled between adjacent delay elements of the first delay chain and a clock input coupled between adjacent delay elements of the second delay chain, thereby capturing a high precision delay measurement for the signals.

12 Claims, 6 Drawing Sheets

(56) References Cited

OTHER PUBLICATIONS

B. Provost et al., AC IO Loopback Design for High Speed uProcessor IO Test, Powerpoint presentation, Oct. 26, 2004.

Freescale Semiconductor, Inc., Multimedia Application Division, Application Note, i.MX51 DDR/mDDR Calibration Procedure, Document Number: AN3992, Rev. 0, Feb. 2010.

P.J. Restle et al., Timing Uncertainty Measurements on the Power5 Microprocessor, IEEE International Solid State Circuits Conference, Session 19, Clock Generation and Distribution 19.7, 2004.

S. Sunter et al., BIST of I/O Circuit Parameters via Standard Boundary Scan, Powerpoint presentation, 2010.

R. Franch et al., On-Chip Timing Uncertainty Measurements on IBM Microprocessors, IEEE International Test Conference, 2007.

R. Franch et al., On-Chip Timing Uncertainty Measurements on IBM Microprocessors, Powerpoint presentation, 2007.

\* cited by examiner

HIGH PRECISION SINGLE EDGE CAPTURE AND DELAY MEASUREMENT CIRCUIT

BACKGROUND OF THE INVENTION

1. Field of the Invention

The present invention is directed in general to signal timing measurements. In one aspect, the present invention relates to an on-chip method and system for calibrating, measuring, and testing integrated circuit device signals.

2. Description of the Related Art

The performance and functionality of various electronic circuits, whether integrated as discrete components or in System-on-a-Chip (SoC) applications, may be evaluated by measuring internal and external signals developed by the electronic circuits. For example, memory subsystems (such as double data rate (DDR) synchronous dynamic random access memory (SDRAM)) require precise timing and testing of the data and clock pins signals to ensure proper operation and compliance with electrical and/or timing specifications, especially as processor and DRAM speeds increase. Conventional signal measurement techniques use external automated test equipment ("ATE") tools which are expensive, slow, and complicated to operate. On-die measurement circuits can also be used, such as delay-chain circuits with a single capture flip-flop, delay locked loop (DLL) circuits for delaying a phase locked loop clock with an interpolator circuit, and circuits with delay-chain and multiple capture flip-flops having an identical clock signal to measure signal skew and jitter. In addition, clocks with different calibration frequencies can be applied to measure a signal across multiple clock cycles using complex control and support logic. Unfortunately, existing signal measurement techniques entail undue circuit complexity and cost, as well as limited measurement granularity or resolution.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
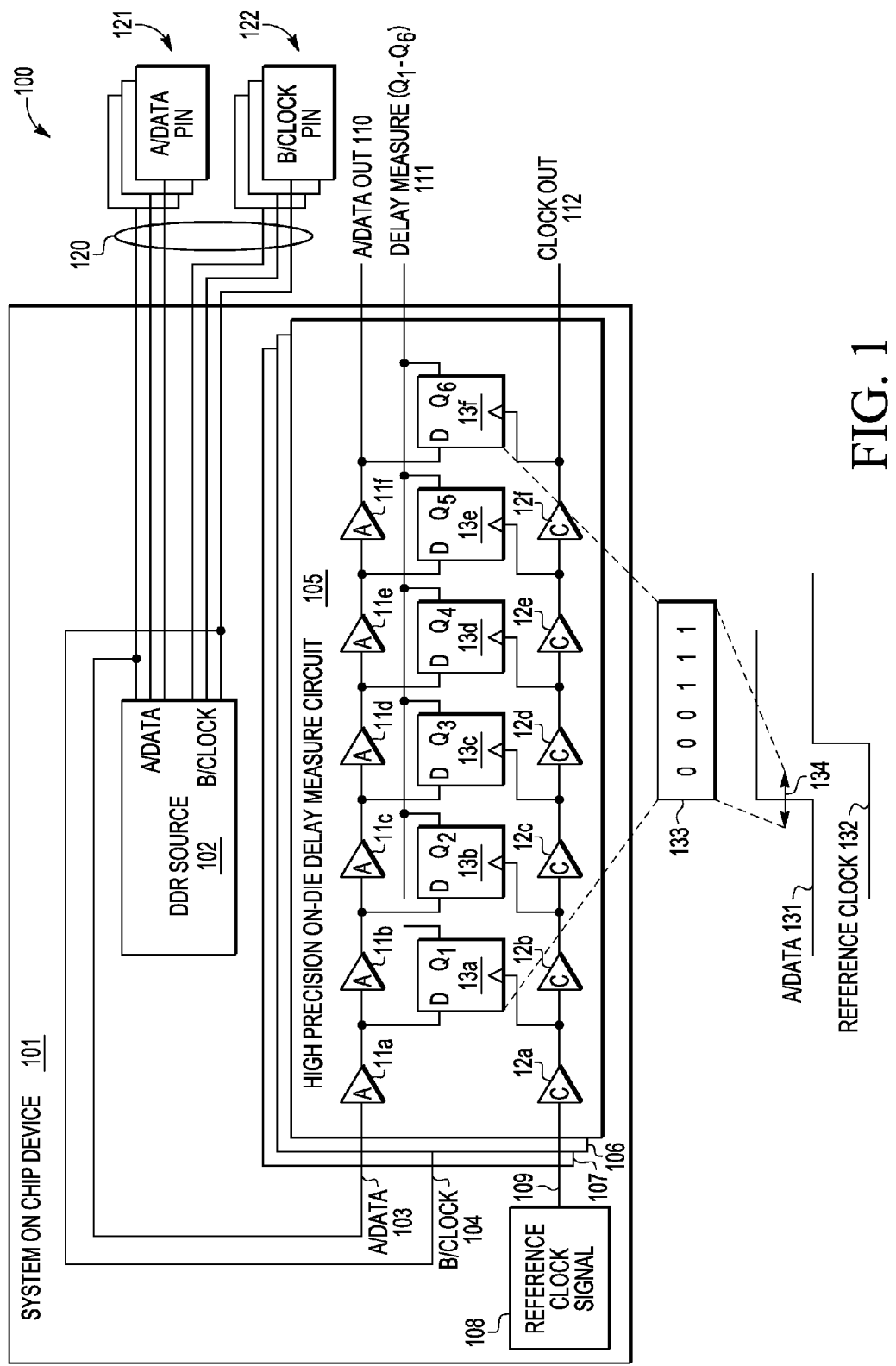
FIG. 1 is a simplified circuit schematic of a high precision on-die measurement circuit for measuring the delay between first and second signals in accordance with selected embodiments of the present invention.

A high precision on-die delay measurement circuit, system, and methodology are described for measuring one or more signals (e.g., data and clock signals) by using a delay difference of two delay chains to clock and capture the signal at a plurality of capture flip-flops to accurately identify a signal transition that can be used to compute propagation delays in the signal(s). By applying a first signal to be measured and a second adjustable clock signal, respectively, to first and second delay chains having different delay values, the delay difference between the first and second signals can be captured at capture flip-flops connected between the delay chains, thereby providing a high precision delay measurement for the first signal against a known "time 0" launch time for the first signal. The delay measurement circuit may include a first multi-tap delay chain connected in series to receive the first signal, and a second multi-tap delay chain connected in series to receive a second independent clock signal that is synchronous or asynchronous with the launch of the first signal. In the embodiment illustrated herein, the per tap delay of the second delay chain is slightly larger than the per tap delay of the first delay chain. In other embodiments, the per tap delay of the second delay chain can also be slightly smaller than the per tap delay of the first delay chain. In addition, capture flip-flops or latches are connected between the first and second delay chains such that the tap points of the first delay chain are respectively connected to the data ports of the capture flip-flops, and the tap points of the second delay chain are respectively connected to the clock ports of the capture flip-flops. With this configuration, the delay between the first and second signals can be derived from the latched values of the capture flip-flops with a measurement precision which is determined by the difference in delay per tap between first and second delay chains. In addition, the delay measurement circuit can be calibrated to determine the measurement precision by connecting the measurement circuit in a ring oscillator configuration where the last block's output is inverted and is enabled to be fed back to the first block's input so that the circuit automatically oscillates infinitely until the ring oscillator configuration is disabled by disabling the feedback path from last block's inverted output to the first block's input. By measuring the oscillator period of the ring oscillators formed from the first and second delay chains, the minimum measurement resolution may be computed based on the number of delay taps and any additional delay elements in the delay measurement circuit (e.g., delay from a multiplexer). In other embodiments, the minimum measurement resolution may be determined with a single measurement by applying the data and clock oscillator ring periods to a balanced mixer and filter. With the disclosed high precision on-die measurement circuit, cost and complexity is reduced for providing production I/O AC specification compliance testing. In addition, fine resolution propagation delay measurements can be obtained for many usages, including but not limited to, signal test and alignment control.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in simplified schematic diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Various illustrative embodiments of the present invention will now be described in detail below with reference to the figures.

Applicants have determined that there is a need for an improved signal measurement system and methodology that address various problems in the art where various limitations and disadvantages of conventional solutions and technologies will become apparent to one of skill in the art. Accordingly, Applicants have disclosed herein various performance and functionality measures for different electronic circuits that may be evaluated by detecting signal transitions of different signals to obtain timing-related information for the signals. To illustrate an example of how signal transitions can be evaluated to measure the delay between two different signals, reference is now made to FIG. 1 which depicts a simplified circuit schematic of a high precision on-die measurement ("ODM") circuit for measuring one or more output signals (e.g., signals A, B) in accordance with selected embodiments of the present invention. In the example shown in FIG. 1, the signals A, B may be generated from the system-on-chip device 101 as data and clock signals from a DDR signal source 102 that are conveyed in parallel over a wide interconnect bus 120 (e.g., a DDR bus) to data and clock pins 121, 122. However, the signal measurement techniques disclosed herein may be used in other applications, including but not limited to evaluating and testing input/output (I/O) interface signals for specification compliance.

In the depicted DDR signal measurement example shown in FIG. 1, one or more high precision on-die measurement ("ODM") circuits 105-107 are provided for evaluating the data and/or clock signals with reduced test time, cost, and complexity as compared to conventional test systems. In particular, a first ODM circuit 105 is connected to measure a first data signal A 103 from the DDR source 102 against a clock input signal 109, a second ODM circuit 106 is connected to measure a second clock signal B 104 from the DDR source 102 against a clock input signal (not separately shown), a third ODM circuit 107 is connected to measure another data or clock signal from the DDR source 102 against a clock input signal (not separately shown), and so on. The clock input signal 109 for the first ODM circuit 105 is shown as being generated with an on-die clock signal generator 108, such as a phase locked loop generator or the like. However, it will be appreciated that the clock input signal for each ODM circuit may be separately generated either on-chip or off-chip so as to be independent and asynchronous or synchronous to the launch of the data signal (e.g., signal A 103) being measured.

Each ODM circuit (e.g., 105) includes first and second delay lines or chains 11, 12. The first delay line 11 receives the first signal 103, such as a data signal being driven out of the I/O 121 by the chip 101, and includes a plurality of delay elements 11a-11f connected in series to generate a delayed output signal 110. In similar fashion, the second delay line 12 receives the independent clock signal 109 which is supplied to a plurality of delay elements 12a-12f connected in series to generate a delayed clock output signal 112. Though illustrated as delay buffers, each of the delay elements 11a-11f, 12a-12f may be implemented with one more inverters, inverting transmission gates, stacked inverters, logic gates, etc. In one embodiment as illustrated herein, the delay elements 12a-12f in the second delay line 12 are designed to have a larger signal delay than the delay elements 11a-11f in the first delay line 11, where the difference in delay defines the minimum resolution d of the ODM circuit 105. In other embodiments, the delay elements 12a-12f in the second delay line 12 can also be designed to have a smaller signal delay than the delay elements 11a-11f in the first delay line 11. In addition, it will be appreciated that the data output signal 110 and clock output signal 112 are used to connect the ODM circuit 105 in a ring oscillator configuration.

The ODM circuit 105 also includes a plurality of sampling latches or flip-flops 13 for tapping the first and second delay lines 11, 12 such that each data input (D) for the sampling latches 13a-13f is connected to a corresponding delay element output from the first delay line 11, and each clock input for the sampling latches 13a-13f is connected to a corresponding delay element output from the second delay line 12. As illustrated, the outputs Q1-Q6 from the sampling latches/flip-flops 13 are connected over one or more (e.g., n) output lines 111 to the edge of the circuit 105 to convey the measurement results from Q1-Q6.

With this configuration, the sampling latches 13a-13f are separately clocked with the outputs of the delay elements 12a-12f from the second delay line 12. The separate clocking is achieved by designing the second delay line 12 to have a different per tap delay from the first delay line 11. With different delays in the first and second delay lines 11, 12, separate clock signals for the sampling latches 13a-13f are derived from the clock signal 109 since each successive sampling latch clock signal is delayed by an additional delay equal to the minimum resolution d. The separately clocked sampling latches 13a-13f thereby operate to pass sampled data (D) received from the first delay line 11 based on the arrival of the successive sampling latch clock signals. In the embodiment shown, six sampling latches 13a-13f may be employed, though additional or fewer sampling latches may be used, depending on the structural or bandwidth requirements of a given device.

By inputting first and second signals (e.g., data signal 103 and clock signal 109) to the ODM circuit 105 to measure edge transitions in the first signal, the delay elements 11a-11f in the first delay line 11 provide delayed versions of first signal A 103 as data inputs (D) for the corresponding sampling latches 13a-13f, and the sampling latches 13a-13f are separately clocked due to the delays introduced by the second delay line 12 to the second signal 109. In cases where the clock signal 109 is slightly early or slightly delayed with respect to the first signal 103 (but still within a predetermined measurement window of the ODM circuit), one or more of the initial sampling latches (e.g., 13a-13c) latch the value of signal A 103 before transition (e.g., logic value 0), while the remaining sampling latches (e.g., 13d-13f) latch the value of signal A 103 after transition (e.g., logic value 1). By analyzing the outputs (e.g., Q1-Q6) from the sampling latches 13a-13f conveyed at the n output lines 111, a delay measure may be derived from the sequence of binary data results stored in the sampling latches 13a-13f, where the edges or transitions are denoted by binary digits of a different value from one another (e.g., 10, 01). In FIG. 1, the transition time window 134 of the data signal 131 is evaluated as a group of binary data results 133 from the sampling registers 13 triggered by the transition of reference clock 132. The transition edge of reference clock 132 is established from a commonly defined "time 0". The delay between "time 0" and the transition edge of 131 is therefore measured with respect to the transition edge of reference clock 132 in combination of the group of binary data results 133. In contrast to conventional delay measurement circuits, the measurement precision of the ODM circuit 105 is not limited by the inverter/buffer delay of delay chains. Instead, the ODM circuit 105 is able to achieve measurement resolution that is defined by the difference in delay d between the delay elements in the first and second chains. Such delay difference can be tuned towards 0ps by circuit design techniques, such as adjusting the load difference between the inverter/buffers in delay chains. Of course, other delay adjustment techniques could be used, including but not limited to using different size and/or VT level transistors for different delay values.

Figure 2:
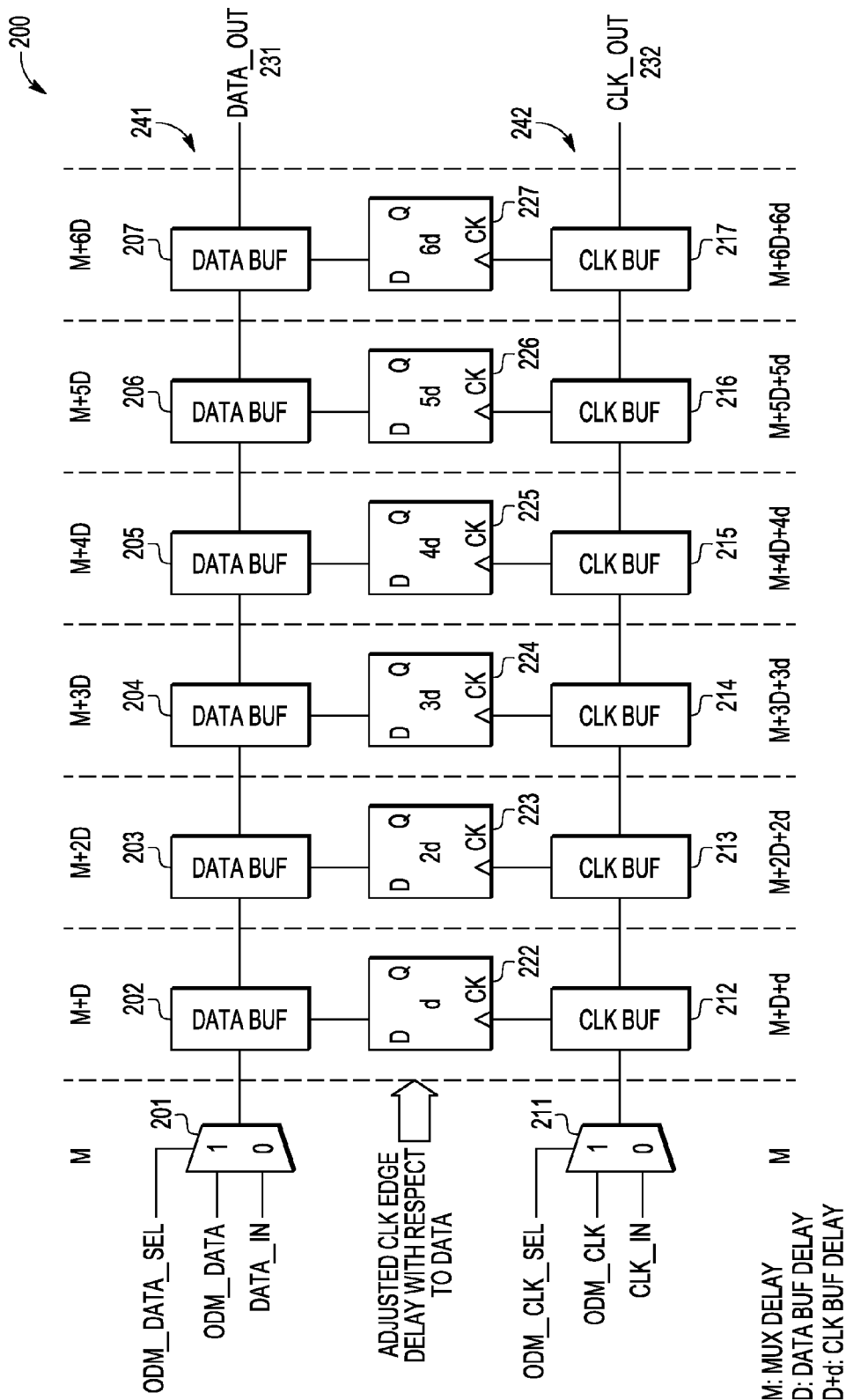
FIG. 2 is a simplified schematic of a built-in self-calibrating delay measurement circuit in accordance with selected embodiments of the present invention.

Referring now to FIG. 2, there is depicted a simplified schematic block diagram of a built-in self-calibrating delay measurement circuit 200 for measuring the delay between a pair of input signals (e.g., data_in and clk_in). In the delay measurement circuit 200, the input signals are connected to first and second delay chains 241, 242 of slightly different delay. The delay measurement circuit 200 also includes a pair of input multiplexers 201, 211 for multiplexing input signals and calibration signals under control of multiplex select lines. The first multiplexer 201 selectively passes a data input signal (data_in) and data calibration signal (odm_data) under control of a first multiplex select line (odm_data_sel), while the second multiplexer 211 selectively passes a clock input signal (clk_in) and clock calibration signal (odm_clk) under control of a second multiplex select line (odm_clk_sel). The pair of input multiplexers 201, 211 may share a common design so that a common delay M is imposed on signals passing through the multiplexers 201, 211.

The first tapped delay chain 241 is formed with delay elements 202-207 and the second tapped delay chain 242 is formed with delay elements 212-217, where the delay elements may be implemented with one or more delay buffers, inverters, inverting transmission gates, stacked inverters, logic gates, etc. In one embodiment as illustrated herein, the delay elements 212-217 in the second delay chain 242 are designed and formed to have a slightly larger delay than the delay elements 202-207 in the first delay chain 241 such that the per-tap delay of the second delay chain 242 is slightly larger than the per-tap delay of the first delay chain 241. In other embodiments, the delay elements 212-217 in the second delay chain 242 can also be designed to have a slightly smaller delay than the delay elements 202-207 in the first delay chain 241 such that the per-tap delay of the second delay chain 242 is slightly smaller than the per-tap delay of the first delay chain 241. For example, the first delay chain buffer 202 imposes a delay D on the received signal, while the second delay chain buffer 212 imposes a delay D+d on the received signal. The cumulative effect of the larger per-tap delay in the second delay chain 242 is that each of the delay elements 212-217 imposes an additional delay value d relative to the signal on the first delay chain 241. This means that the cumulative output from the data chain buffer 202 has a delay of M+D and the cumulative output from the clock chain buffer 212 has a delay of M+D+d, while the output from the data chain buffer 203 has a delay of M+2D and the output from the clock chain buffer 213 has a delay of M+2D+2d, and so on. At the end of the first and second delay chains 241, 242, the data output data_out from the first delay chain 241 has a total delay of M+6D, while the clock output clk_out from the second delay chain 242 has a total delay of M+6D+6d.

To capture edge arrivals in the first input signal (e.g., data_in) in relation to the second clock signal (e.g., clk_in), a set of sampling latches 222-227 is connected to tap the first delay chain 241 under control of clocks provided by the second delay chain 242. In selected embodiments, the sampling latches 222-227 are implemented as flip-flop (FF) devices such that tap points of the first delay chain 241 are connected to data ports of the FE latches 222-227, and the tap points of the second delay chain 242 are connected to clock ports of the same FE latches 222-227. With this configuration, the delay between two input signals (e.g., data_in and clk_in passed by input multiplexers 201, 211) can be derived from the latched values of the FE latches 222-227 which are clocked with adjusted clock edges from the second delay chain 242. And by using control logic outside of the delay measurement circuit 200 which has established a shared common start time "time 0" before the launch of the data data_in for the pair of input signals, the observed edge arrival in the first input signal (e.g., data_in) captured at the sampling latches 222-227 can be used to measure or compute the relative arrival time of the edge on the first input signal. The measurement precision is not limited by the inverter/buffer delay of delay chains 241, 242, but by the difference d between the delay elements in the two delay chains 241, 242. With the disclosed high precision on-die measurement circuit, cost and complexity is reduced for providing production I/O specification compliance testing. In addition, fine resolution propagation delay measurements can be obtained for many usages, including but not limited to signal test and alignment control.

In addition to measuring the delay of one or inure input signals, the delay measurement circuit 200 may be calibrated to determine the minimum measurement resolution value d. To this end, calibration signals (e.g., odm_data and odm_clk) may be multiplexed with the input signals at the input multiplexers 201, 211 under control of one or more multiplex select lines (e.g., odm_data_sel, odm_clk_sel) during a calibration test mode in which one or more delay measurement circuits are placed into a ring oscillation configuration. A calibration signal is generated by a ring oscillator where the output data_out of the circuit 200 is inverted and fed back as the input odm_data to the first delay chain 241 to determine the clock period of the data ring (e.g., Pdata). In similar fashion, a clock calibration signal odm_clk generated with the circuits in a ring oscillator mode may be multiplexed through the second delay chain 242 under control of a multiplex select line (e.g., odm_clk_sel) to determine the clock period of the clock ring (e.g. Pclk). Before placing the circuit into the ring oscillator configuration, the delay measurement circuit(s) should be quiesced or in a static condition so that there are no transitions traversing any of the circuits. When the selection multiplexer connects the delay measurement circuit(s) into the oscillator ring configuration with its inverted feedback path, it starts to generate the pulses. The clock periods (e.g., Pdata, Pclk) for the data and clock calibration signals may be employed to compute the minimum measurement resolution d based on the number of delay taps and any additional delay elements in the delay measurement circuit (e.g., delay from a multiplexer). An oscillating signal period is formed by the signal propagating through all delay elements twice—once as "zero" and once as "one." For example, if there are N delay measurement circuits 200 connected in series to form a ring oscillator, where each delay measurement circuit includes six FF latches, then the computed ODM measurement resolution d may be computed as a function of the difference between the measured clock periods divided by twice the number of sampling latches in each oscillator ring (e.g., $d=(Pclk-Pdata)/(2\times(\text{\# of sampling latches in each ODM})\times N)$ (e.g., $d=(Pclk-Pdata)/2\times6\times N$.

Figure 3:
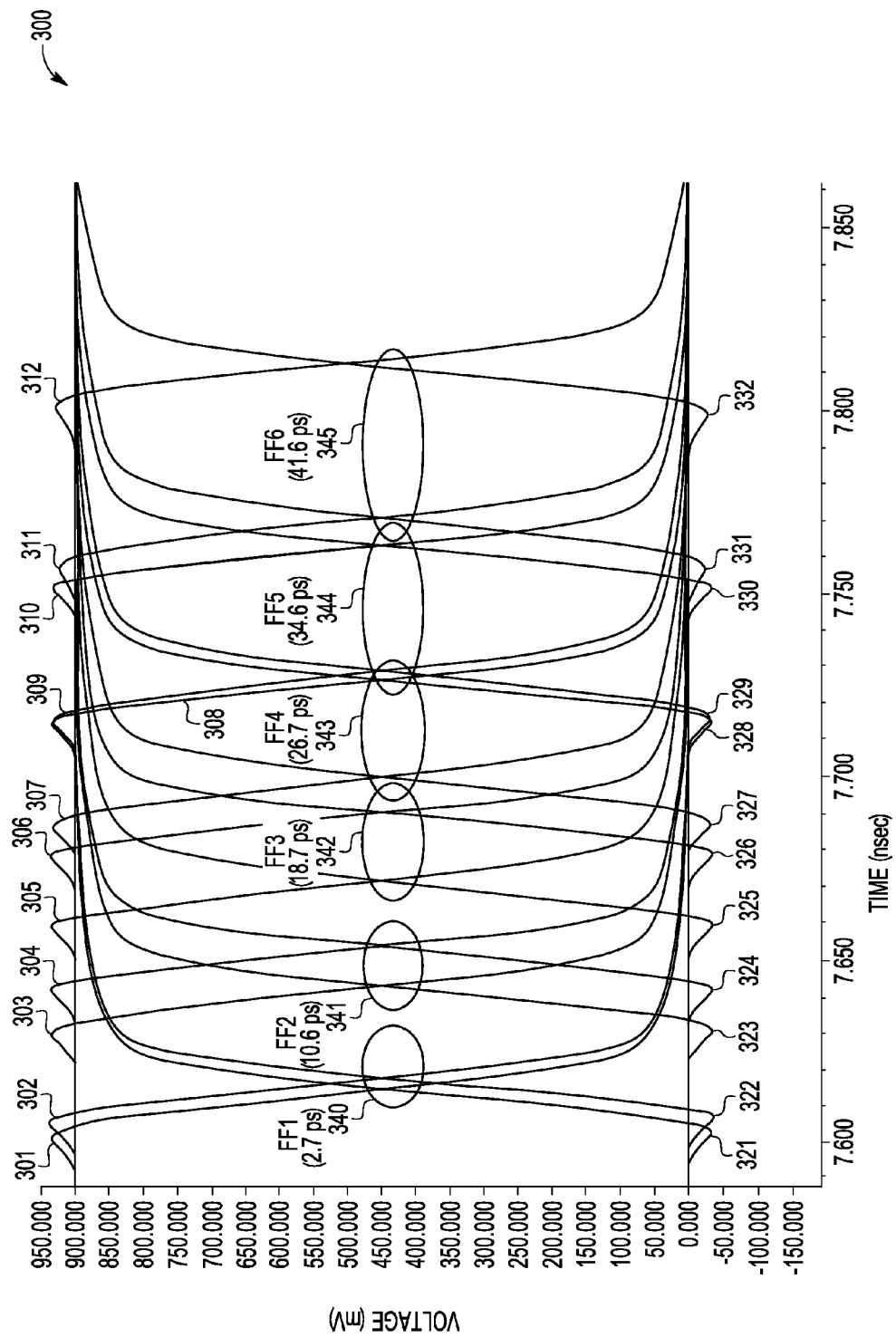
FIG. 3 depicts a simulation plot of the signal transition delays measured at different flip-flop devices of an on-die measurement circuit in accordance with selected embodiments of the present invention.

To illustrate the operation of the ODM circuit 200, reference is now made to FIG. 3 which depicts a simulation plot 300 of the signal transitions for the input signal pairs applied to the first and second delay chains 241, 242 and measured at the data (e.g., D) and clock (e.g., clk) pins of different sampling flip-flops 222-227. Waveforms 301, 321 show the fall and rise data pin transitions, and waveforms 302, 322 show the fall and rise clock pin transitions of the first sampling flip-flop (222). This first pair of data (301, 321) and clock (302, 322) signals of the first flip-flop 222 has a first minimal delay therebetween (e.g. 2.7 ps), as indicated at 340. A larger delay (e.g., 10.6 ps) between a second pair of data (303, 323) and clock (304, 324) signals of the second sampling flip-flop (223) is indicated at 341. In similar fashion, longer delays between the data/clock signals of subsequent sampling latches, including the third sampling latch 224 (e.g. 18.7 ps delay between data (305, 325) and clock (306, 326) signals as indicated at 342), the fourth sampling latch 225 (e.g. 26.7 ps delay between data (307, 327) and clock (308, 328) signals as indicated at 343), the fifth sampling latch 226 (c.a. 34.6 ps delay between data (309, 329) and clock (310, 330) signals as indicated at 344), and the sixth sampling latch 227 (e.g. 41.6 ps delay between data (311, 331) and clock (312, 332) signals as indicated at 345).

Figure 4:
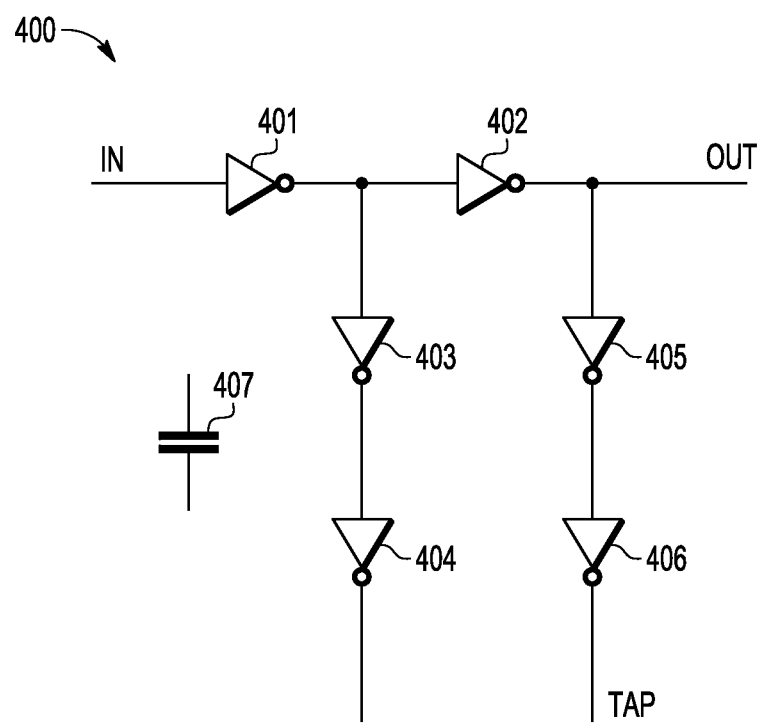
FIG. 4 is a simplified circuit schematic of a delay buffer structure which may be used in the delay measurement circuit in accordance with selected embodiments of the present invention.

As indicated above, the minimum measurement resolution d for the delay measurement circuit can be tuned towards 0ps by circuit design techniques such as adjusting the load difference between the delay buffer elements in the first and second delay chains. To illustrate the tuning of a delay buffer element, reference is now made to FIG. 4 which shows a simplified circuit schematic of a delay buffer structure 400 which may be used in the delay measurement circuit in accordance with selected embodiments of the present invention. As depicted, an incoming signal (e.g., data signal or clock signal) is received at the input pin "in" and supplied to an inverter chain of a series-connected first inverter 401 and second inverter 402 to generate an output signal at the output pin "out." The "in" and "out" pins may be used to connect the delay buffer to other buffers on a delay chain one after another. The first inverter 401 drives a first output inverter chain 403, 404, while the second inverter 402 drives a second output inverter chain 405, 406 which generates an output "tap" pin. The "tap" pin is connected to a data port of a sampling latch for sampling the amount of delay at a specific buffer stage in the case of the data signal, or to the clock port of a sampling latch in case of a clock signal. Using the output inverter chain 405, 406, the output "tap" pin is isolated from the logic path between the "in" and "out" pins so that sampling does not affect overall delay precision. In addition, the capacitor structure 407 is provided to stabilize voltage supply and reduce delay variation. As will be appreciated, the capacitor structure 407 is connected as a decoupling capacitor between power supply and ground so that any voltage fluctuations at power supply and ground are absorbed at least in part by the capacitor structure 407, thereby reducing the amount of delay fluctuation.

As described herein, the resolution of the high precision on-die measurement circuit can be calibrated by connecting the delay chains into ring oscillator configurations and evaluating the differences of the two oscillating frequencies. To provide an example implementation, reference is now made to FIG. 5 which depicts a simplified schematic block diagram 500 of a plurality of on-die measurement (ODM) circuits 511-514 connected in a ring oscillator configuration for calibrating the measurement resolution of the ODM circuits. In normal operation, input multiplexers in each ODM circuit (e.g., 511) convey input data and clock signals (e.g., data_in and clk_in) to the first and second delay chains, and delayed output signals (data_out and clk_out) are generated from the delay chains along with binary data results from the outputs (Q) of the sampling latches. The received input data signals are driven out of a corresponding I/O 501-501, and the received input clock signal comes from an independent clock signal generator which is independent and asynchronous to the received input data signal being measured. However, in the ring oscillator configuration, the ODM circuits 511-514 are connected in series using the input multiplexers in the ODM circuits 511-511 to create feedback paths to form the Data Ring Oscillator 520 and the Clock Ring Oscillator 530. For calibration mode, all circuit inputs are statically held to the same values for each ODM circuit 511-514 for long enough that there are no internal events still occurring. Then, the odm_data_sel input to the multiplexor 201 and odm_clk_sel to the multiplexor 211 will transition to select the odm_data amd odm_clock inputs. This will pass in the inverted values of the previous static values of data_out of 514 and clk_out of 514 to the odm_data and odm_clk inputs of 511. In this way, the ODM circuits 511-514 are connected in a ring with the data output signal (data_out) 521 from the last ODM circuit 514 being inverted at inverter 522 and fed back as a data input (odm_data) to the first ODM circuit 511. Similarly, the input multiplexers during calibration mode convey the clock output signal (clk_out) 531 from the last ODM circuit 514 to inverter 532 and feed back the inverted clock output signal as a clock input (odm_clk) to the first ODM circuit 511. In this way, ring oscillators are formed with the first and second delay chains in the ODM circuits 511-514 so that the measurement resolution can be calibrated by computing d from the measured oscillating frequency difference between the first and second delay chains.

Figure 5:
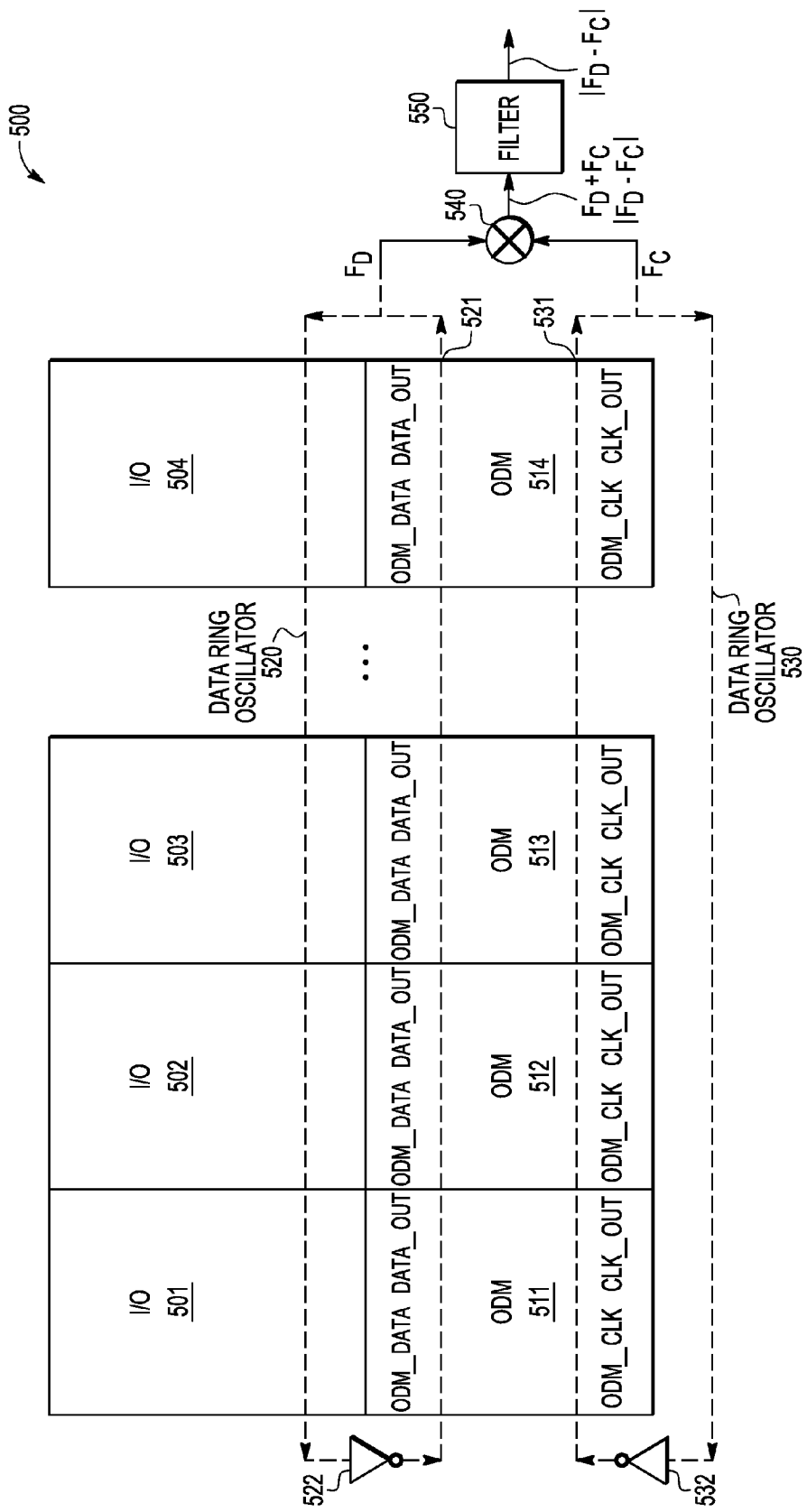
FIG. 5 is a simplified schematic block diagram of a plurality of delay measurement circuits connected in a ring oscillator configuration for calibrating the measurement resolution of the delay measurement circuits in accordance with selected embodiments of the present invention.

The computation or calibration of the minimum measurement resolution d between the inputs signals can be illustrated with reference to the example of FIG. 5 where there are N=13 ODM circuits connected in series, with each ODM circuit including first and second delay chains with a sampling latches connected therebetween. In this example, the first data delay chain in each ODM circuit includes a selection multiplexer circuit which adds predetermined mux delay (M) (e.g., 40 ps) and six data delay buffers which each add a predetermined data buffer delay (D) (e.g., 28 ps). In the second clock delay chain of each ODM circuit, there is a selection multiplexer circuit which adds predetermined mux delay (M) (e.g., 40 ps) and six slower clock delay buffers which each add a predetermined clock buffer delay (D+d) (e.g., 36 ps). With this example, the data ring oscillator period Pdata=N×(M+6D)×2=5.408 ns, and the clock ring oscillator period Pclk=N×(M+6D+6d)×2=6.656 ns, in which case the minimum resolution d may be computed as d=(Pclk−Pdata)/12N=8 ps.

In accordance with alternate embodiments, the minimum resolution d may be computed with a single measurement by using a balanced mixer 540 and filter 550 to process the frequencies of the first and second ring oscillator delay chains 520, 530. In FIG. 5, the alternate embodiments are illustrated with mixer 540 which is coupled to the data and clock outputs of the last ODM circuit 514 to combine the frequency of the first tapped delay chain, $f_D$, and the frequency of the second tapped delay chain $f_C$, resulting in a mixer output signal which simultaneously provides the sum of these two frequencies $(f_D+f_C)$ and the difference $(|f_D-f_C|)$. The mixer 540 output is coupled to a filter 550 which passes the desired resulting frequency and rejects the other. In an example implementation, the filter 550 is an appropriately designed low pass fitter which passes the difference of these two frequencies $(|f_D-f_C|)$ to the output, and blocks the sum of these two frequencies ($f_D+f_C$). Thus, the value of d can be determined via a single measurement.

Figure 6:
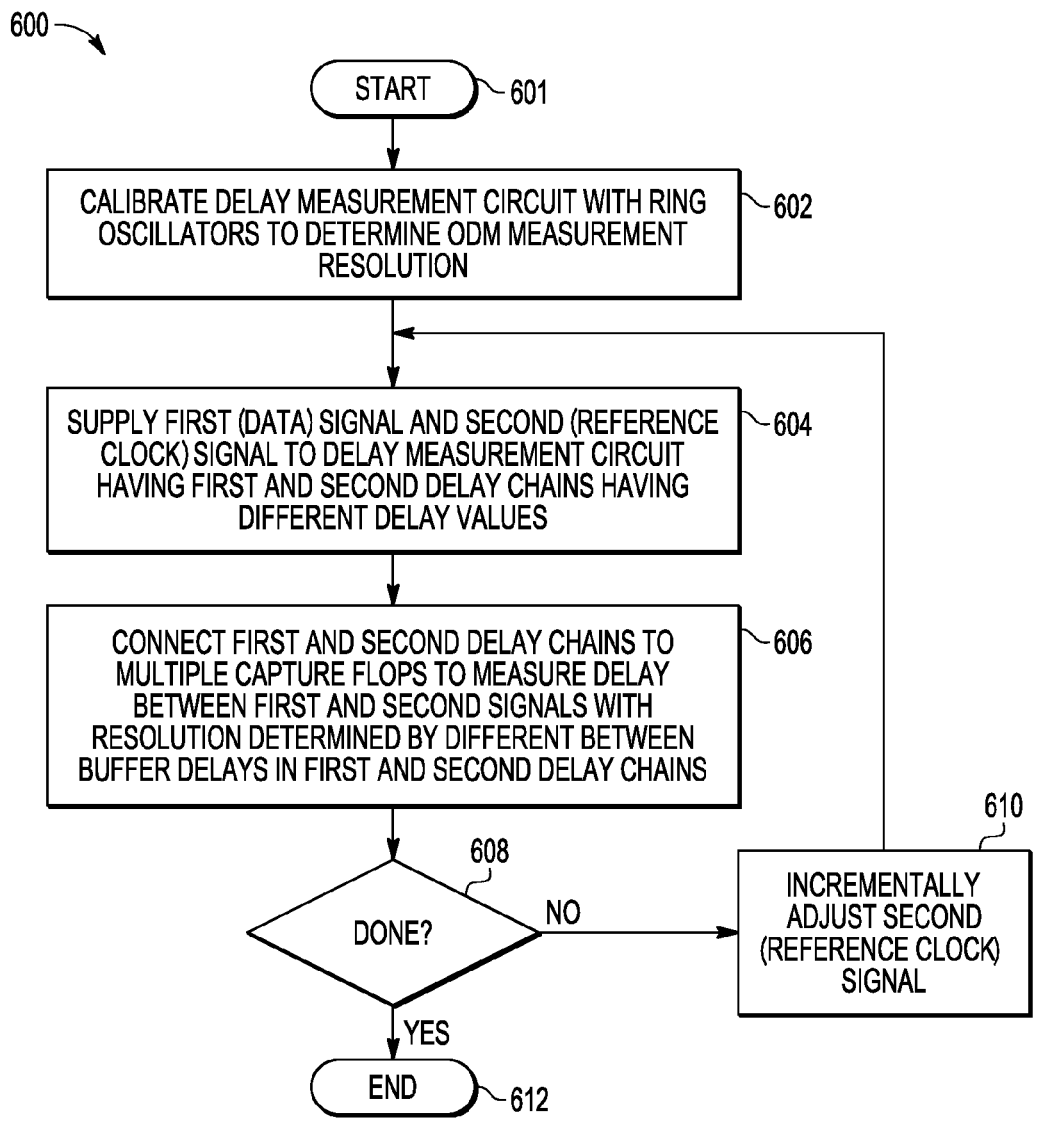
FIG. 6 depicts an example flow diagram for providing a high resolution measurement of the delay between two signals in accordance with selected embodiments of the present invention.

Referring now to FIG. 6, there is depicted an example flow diagram 600 for providing a high resolution measurement of signal transitions in a first signal relative to a second known signal. Once the sequence starts at step 601, the measurement circuit having first and second delay chains having different per stage delays is calibrated to determine the minimum measurement resolution (step 602). This may be done by connecting the delay chains into a ring oscillator configuration by connecting one or more delay measurement circuits in an inverted feedback loop so that outputs from first and second delay chains are inverted and fed back as inputs to determine their different clock periods. In this configuration, the measurements of the oscillating frequencies are used to identify the clock periods Pdata, Pclk for the first and second delay chains. Using appropriate logic control to process the measured clock periods for the first and second delay chains, the minimum measurement resolution d may be computed as a function of the difference between the measured clock periods divided by twice the number of sampling latches in each oscillator ring (e.g., d=(Pclk−Pdata)/(2×(# of sampling latches in each ODM)×N).

At step 604, first and second signals are supplied to the calibrated delay measurement circuit, where the first signal may be a data or clock signal to be measured, and the second signal may be a reference clock signal against which the first signal is measured. To supply the signals, input selection multiplexers may be used to connect the first and second signals to the first and second delay chains in the delay measurement circuit, where the second delay chain has delay elements with different per-tap delay values from the delay elements in the first delay chain. When the first and second signals are supplied, the launch time (t=0) for both signals is known, and the arrival time of a reference edge in the second signal is also known.

At step 606, the first and second delay chains are connected to multiple capture flip-flops or sampling latches to measure the delay between the first and second signals. This may be accomplished by connecting a chain of capture flip-flops between first and second tapped delay chains such that the tap points of the first tapped delay chain are respectively connected to the data ports of the capture flip-flops, and the tap points of the second tapped delay chain are respectively connected to the clock ports of the capture flip-flops.

As indicated at step 608, the measurement process continues until the capture flip-flops provide a delay measure with respect to an edge transition in the first signal, indicating that the measurement process is done. If not (negative outcome to decision 608), the second clock signal (e.g., reference clk signal) is moved incrementally relative to the first signal being measured (e.g., data signal) at step 610 before returning to step 604 where the first signal and (adjusted) second signal are supplied to the measurement circuit. The first repetition will capture the value before the transition on the first (data) signal, and each repeat sequence moves the edge of the second (reference clock) signal by less than the amount of time spanned by the ODM circuit. Eventually, the clock edge will move into the range of time where the edge transition can be captured into the capture latches, where some latches capture the value before the transition and some capture the value after the transition. Since the second (reference clock) signal moves less than the span of the delay covered by the circuit, there will be at least one repetition where the edge is detected. By adjusting the arrival of the second signal (with its known launch and arrival times) until the capture flip-flops provide a delay measure with respect to an edge transition in the first signal (affirmative outcome to decision 608), the delay measurement circuit can measure propagation delays in the first signal caused by the logic and connections of a signal path including the delay difference created by process, voltage or temperature (PVT) variations associated with the chip manufacture or operation. The measurement resolution achieved at this step is determined by the difference between the buffer delays in the first and second delay chains, and can be adjusted by circuit design techniques such as changing the load of inverter/buffer in two different delay chains. At step 612, the sequence ends.

Using the signal measurement techniques disclosed herein, the propagation delays for both data pin and clock pin signals from a common point in time can be measured by applying the data pin and clock pin signals to separate on-die measurement circuits to observe points for AC specifications for timing performance and relationship requirements at the I/O pins. On-die measurement of AC spec performance can have significant test time and test cost saving over using high-end precision ATE for specification compliance measurements in production. In addition, the compact design of the ODM circuits can be efficiently replicated for use in measuring AC specification performance of wide busses, such as DDR output lines, which require multiple paths to be tested in parallel.

As will be appreciated, the signal measurement circuits and methods described herein provide a simple way of achieving high-precision on-die measurement with small area and simple control, and may be employed to detect edges or transitions in signals which can be used to obtain pulse widths, access times, setup times, hold times, and other relevant information for purposes of evaluating or testing a circuit. In selected embodiments, the delay measurement circuit may be incorporated into a circuit library and/or into a chip design in order to monitor or measure signals to provide information on operational functions and output directly from the chip being tested or measured. In addition, the delay measurement circuit may be embodied in hardware, in software executed by processing circuitry (e.g., including but is not limited to firmware, resident software, microcode, etc.), or in some combination of hardware and software elements. Furthermore, at least portions of the delay measurement circuit may be embodied as a computer program product accessible from a computer-usable or computer-readable medium providing program code for use by or in connection with a computer or any instruction execution system, where a computer-usable or computer readable medium can be any apparatus that may include, store, communicate, propagate, or transport the program for use by or in connection with the instruction execution system, apparatus, or device. Examples of a non-transitory computer-readable medium include a semiconductor or solid state memory, magnetic tape, a removable computer diskette, a random access memory (RAM), a read-only memory (ROM), a rigid magnetic disk and an optical disk, such as a compact disk-read only memory (CD-ROM), compact disk-read/write (CD-R/W) and DVD.

By now it should be appreciated that there has been provided a circuit, method and system circuit which includes a first and second delay chains connected to a plurality of sampling latches which provide a digital sample of an edge transition in the first signal relative to the second signal when the edge transition occurs within a minimum resolution d of the circuit. The first delay chain includes delay elements connected to receive a first signal from an on-chip circuit component, where each delay element in the first chain has a first delay value. The second delay chain includes delay elements connected to receive a reference clock signal, where each delay element in the second chain has a second delay value that is different from the first delay value. In selected embodiments, the first and second delay chains are formed with first and second multi-tap delay chains of delay buffers connected in series to receive, respectively, the first signal and reference clock signal that is asynchronous with the first signal. When the per tap delay of the second multi-tap delay chain is different from the per tap delay of the first multi-tap delay chain, the difference between the per tap delay of the second multi-tap delay chain and the per tap delay of the first multi-tap delay chain provide a measurement precision of the circuit. The sampling latches may be formed with flip-flop devices, and are connected between the first and second delay chains with each sampling latch having a data input coupled between adjacent delay elements of the first chain and a clock input coupled between adjacent delay elements of the second chain such that an edge transition in the first signal is indicated by digital values stored in the plurality of sampling latches when the edge transition relative to the reference clock signal occurs within a predetermined measurement window of the circuit. In selected embodiments, each delay element may include a first inverter chain connected to receive an input at an input port and to generate a first delayed version of the input at an output port, and a second inverter chain connected to the output port for generating a second delayed version of the input as a tap output that is isolated from the output port and connected to one of the plurality of sampling latches. In addition, an on-chip clock signal generator generates the reference clock signal which is independent and asynchronous to the first signal. The circuit may also include a first input multiplexer for multiplexing a first input signal and a first calibration signal to supply the first signal to the first chain of delay elements under control of a first multiplex select line, and a second input multiplexer for multiplexing a first clock signal and a first clock calibration signal to supply the reference clock signal to the second chain of delay elements under control of a second multiplex select line.

In another form, there is provided a measurement method and circuit for measuring an edge transition in a first signal generated by an integrated circuit. In the disclosed methodology, a first signal from an on-chip circuit component is applied to a first chain of delay elements, where each delay element in the first chain has a first delay value. The first signal may be received as a data signal or clock signal from a DDR or other logic block or source of signals, where the data clock signal is also conveyed over an interconnect bus to an output data/clock pin. In addition, a reference clock signal is applied to a second chain of delay elements, where each delay element in the second chain has a second delay value that is different from the first delay value. Using a plurality of sampling latches (e.g., flip-flop devices), the first chain is tapped between adjacent delay elements by coupling each sampling latch data input to a corresponding delay element in the first chain and coupling each sampling latch clock input to a corresponding delay element in the second chain. In selected embodiments, the reference clock may be applied by incrementally adjusting the reference clock signal relative to the first signal until an edge transition in the clock signal and the transition in the first signal move into a predetermined measurement window during which the transition in the first signal is captured by the plurality of sampling latches. Logic is then used to compare adjacent outputs of the sampling latches in an output sequence to indicate a transition in the first signal. The comparison results may be used to measure a pulse width, access time, setup time, hold time, and/or duty cycle based on a transition in the first signal. In addition, a delay in the second chain may be adjusted to control a minimum precision measure for the transition indication, such as by adjusting a per tap delay of the second chain relative to a per tap delay of the first chain to provide a measurement precision d. In selected embodiments, a minimum precision measure for the transition indication may be calibrated by connecting the first and second chains of delay elements into first and second ring oscillator configurations, respectively, to respectively measure a data ring oscillator period Pdata and clock ring oscillator period Pclk, and then computing a minimum precision measurement d as a function of a difference value between the clock ring oscillator period Pclk and data ring oscillator period Pdata. For example, the minimum precision measurement d may be computed by dividing the difference value by twice the number of delay elements in the first ring oscillator configuration.

In yet another form, there is provided a method and circuit for calibrating an on-die measurement circuit which has first and second multi-tap delay chains connected to a chain of capture latches such that tap points of the first multi-tap delay chain are respectively connected to data ports of the capture latches and tap points of the second multi-tap delay chain are respectively connected to clock ports of the capture latches, where the second multi-tap delay chain has a per tap delay that is slightly different from a per tap delay of the first multi-tap delay chain. In the disclosed calibration technique, the first multi-tap delay chain is connected in a first ring oscillator configuration to measure a data ring oscillator period Pdata. In addition, the second multi-tap delay chain is connected in a second ring oscillator configuration to measure a clock ring oscillator period Pclk. In this way, the minimum precision measurement d for the on-die measurement circuit may be computed as a function of a difference value between the clock ring oscillator period Pclk and data ring oscillator period Pdata. In selected embodiments, the minimum precision measurement d may be computed by applying an output from the first multi-tap delay chain and an output from the second multi-tap delay chain to a frequency mixer, where the output from the first multi-tap delay chain has a data ring frequency $f_D$ from the data ring oscillator period Pdata, and where the output of the second multi-tap delay chain has a clock ring frequency $f_C$ representing an inverse of the clock ring oscillator period Pclk, such that the frequency mixer combines the data ring frequency $f_D$ and the clock ring frequency $f_C$ into a mixer output signal. Thereafter, the mixer output signal is filtered to pass only a difference between the data ring frequency and the clock ring frequency ($|f_D - f_C|$), thereby generating the minimum precision measurement d.

The high precision single edge capture and delay measurement circuit described herein provides higher measurement resolution than conventional delay-chain circuits which have measurement resolution that is limited by the delay inverter/buffer delay, and therefore not suitable for high-performance IO interfaces. In addition, the disclosed single edge capture and delay measurement circuit may be implemented with a small footprint circuit that does not require large, complex DLL and interpolator circuits to achieve the measurement resolution of DLL/interpolator circuits. And in contrast to systems which use complex control and support logic to apply clocks with different calibration frequencies to measure a signal across multiple clock cycles, the disclosed single edge capture and delay measurement circuit uses a single reference clock to measure a single signal edge with a simple circuit. The disclosed single edge capture and delay measurement circuit also provides a measurement resolution that is defined by the difference in delay d between the delay elements in the first and second chains, and is not limited by the inverter delay resolution limit provided by circuits which are calibrated by performing frequency sweeps.

Although the described exemplary embodiments disclosed herein are directed to methods and systems for providing high precision delay measurement using the delay difference of two delay chains in combination of flip-flops, the present invention is not necessarily limited to the example embodiments illustrate herein, and various embodiments of a measurement circuit and methodology disclosed herein may be implemented with other circuit components. For example, the sampling latches may use different flip-flop designs and/or different clocking schemes to provide different delayed clocks to the sampling latches. The per tap delay of first delay chain can be either larger or smaller than the per tap delay of the second delay chain. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements hut may include other elements not expressly listed or inherent to such process, method, article, or apparatus.

What is claimed is:

1. A circuit comprising:
   a plurality of delay measurement circuits connected in a ring oscillator configuration, each delay measurement circuit comprising:
   a first chain of delay elements connected to receive a first signal from an on-chip circuit component, where each delay element in the first chain has a first delay value;
   a second chain of delay elements connected to receive a reference clock signal, where each delay element in the second chain has a second delay value that is different from the first delay value; and
   a plurality of sampling latches connected between the first and second chains, each sampling latch having a data input coupled between adjacent delay elements of the first chain and a clock input coupled between adjacent delay elements of the second chain such that an edge transition in the first signal is indicated by digital values stored in the plurality of sampling latches when the edge transition relative to the reference clock signal occurs within a predetermined measurement window of the circuit; and
   a frequency mixer comprising a first input coupled to receive an output from the first chain of delay elements of the last delay measurement circuit connected in the ring oscillator configuration to measure a data ring oscillator period, a second input coupled to receive an output from the second chain of delay elements of the last delay measurement circuit connected in the ring oscillator configuration to measure a clock ring oscillator period, and a frequency mixer output, where the output from the first chain of delay elements has a data ring frequency $f_D$) from the data ring oscillator period, and where the output of the second chain of delay elements has a clock frequency $f_C$ representing an inverse of the clock ring oscillator period, such that the frequency mixer combines the data ring frequency $f_D$ and the clock ring frequency $f_C$ to generate a mixer output signal at the frequency mixer output.

2. The circuit of claim 1, where the first chain of delay elements in each delay measurement circuit comprises a first multi-tap delay chain of delay buffers connected in series to receive the first signal, and the second chain of delay elements in each delay measurement circuit comprises a second multi-tap delay chain of delay buffers connected in series to receive the reference clock signal that is asynchronous with the first signal.

3. The circuit of claim 2, where the second multi-tap delay chain has a per tap delay that is different from a per tap delay of the first multi-tap delay chain.

4. The circuit of claim 3, where a difference between the per tap delay of the second multi-tap delay chain and the per tap delay of the first multi-tap delay chain provides a measurement precision of the circuit.

5. The circuit of claim 1, where each delay element in the first and second chains comprises:
   a first inverter chain connected to receive an input at an input port and to generate a first delayed version o f the input at an output port; and
   a second inverter chain connected to the output port for generating a second delayed version of the input as a tap output that is isolated from the output port and connected to one of the plurality of sampling latches.

6. The circuit of claim 1, where the plurality of sampling latches comprises a plurality of flip-flop devices.

7. The circuit of claim 1, further comprising a clock signal generator for generating the reference clock signal which is independent and asynchronous to the first signal.

8. The circuit of claim 1, where the plurality of sampling latches provides a digital sample of one or more edge transitions in the first signal relative to the second signal when the edge transition occurs within a minimum resolution d of the circuit, 9. The circuit of claim 1, further comprising:
   a first inverter for feeding back the output from the first chain of delay elements of the last delay measurement circuit connected in the ring oscillator configuration to a first input to the plurality of delay measurement circuits connected in the ring oscillator configuration; and
   a second inverter for feeding back the output from the second chain of delay elements of the last delay measurement circuit connected in the ring oscillator configuration to a second input to the plurality of delay measurement circuits connected in the ring oscillator configuration.

10. The circuit of claim 1, further comprising:
    a filter connected to filtering the mixer output signal to pass only a difference between the data ring frequency and the clock ring frequency ($|f_D-f_C|$), thereby generating the minimum precision measurement d for the circuit.

11. A method for calibrating an on-die measurement circuit comprising , first and second multi-tap delay chains connected to a chain of capture latches such that tap points of the first multi-tap delay chain are respectively connected to data ports of the capture latches and tap points of the second multi-tap delay chain are respectively connected to clock ports of the capture latches, where the second multi-tap delay chain has a per tap delay that is different from a per tap delay of the first multi-tap delay chain, comprising:

connecting the first multi-tap delay chain in series with a plurality of delay measurement circuits in a first ring oscillator configuration to measure a data ring oscillator period;

connecting the second multi-tap delay chain in series with the plurality of delay measurement circuits in a second ring oscillator configuration to measure a clock ring oscillator period; and computing a minimum precision measurement d for the on-die measurement circuit as a function of a difference value between the clock ring oscillator period and data ring oscillator period.

12. The method of claim 11, where computing the minimum precision measurement d comprises:

applying an output from the first multi-tap delay chain and an output from the second multi-tap delay chain to a frequency mixer, where the output from the first multi-tap delay chain has a data ring frequency $f_D$ from the data ring oscillator period, and where the output of the second multi-tap delay chain has a clock ring frequency $f_C$ representing an inverse of the clock ring oscillator period, such that the frequency mixer combines the data ring frequency $f_D$ and the clock ring frequency $f_C$ into a mixer output signal;

filtering the mixer output signal to pass only a difference between the data ring frequency and the clock ring frequency ($|f_D-f_C|$), thereby generating the minimum precision measurement d.

* * * * *

UNITED STATES PATENT AND TRADEMARK OFFICE
CERTIFICATE OF CORRECTION

PATENT NO.         : 8,736,338 B2
APPLICATION NO.    : 13/444195
DATED              : May 27, 2014
INVENTOR(S)        : Lipeng Cao et al.

It is certified that error appears in the above-identified patent and that said Letters Patent is hereby corrected as shown below:

In the Claims

Column 14, line 8, Claim 1 should read "$f_D$ from the data ring oscillator period, and where the"

Column 14, lines 47-48, Claim 8 should read "edge transition occurs within a minimum resolution $d$ of the circuit."

Column 14, line 67, Claim 11 should read "comprising first and second multi-tap delay chains con-"

Column 15, line 16, Claim 11 should read "computing a minimum precision measurement $d$ for the"

Column 16, line 2, Claim 12 should read "mum precision measurement $d$ comprises:"

Signed and Sealed this
Ninth Day of September, 2014

Michelle K. Lee
*Deputy Director of the United States Patent and Trademark Office*